April 10, 1962 WEN YUAN PAN 3,029,339

VARIABLE TUNING CIRCUIT

Filed Jan. 26, 1959 4 Sheets-Sheet 1

INVENTOR.
WEN YUAN PAN
BY
[signature]
ATTORNEY

INVENTOR.
WEN YUAN PAN
BY A. Russinoff
ATTORNEY

April 10, 1962 — WEN YUAN PAN — 3,029,339

VARIABLE TUNING CIRCUIT

Filed Jan. 26, 1959 — 4 Sheets-Sheet 3

INVENTOR.
WEN YUAN PAN

BY A. Russinoff
ATTORNEY

April 10, 1962 WEN YUAN PAN 3,029,339

VARIABLE TUNING CIRCUIT

Filed Jan. 26, 1959 4 Sheets-Sheet 4

INVENTOR.
WEN YUAN PAN
BY A. Russinoff
ATTORNEY

United States Patent Office 3,029,339
Patented Apr. 10, 1962

3,029,339
VARIABLE TUNING CIRCUIT

Wen Yuan Pan, Haddon Heights, N.J., assignor to Radio Corporation of America, a corporation of Delaware Filed Jan. 26, 1959, Ser. No. 788,935
12 Claims. (Cl. 250—20)

This invention relates to tunable resonant circuits ot the type useful in electronic apparatus such as radio signal receivers, and more particularly to circuits which are adapted to efficiently utilize voltage responsive reactance d vices such as variable capacitance diodes for tuning over a wide range of frequencies.

It is often necessary in electronic apparatus to provide resonant circuits which may be tuned over a wide range of frequencies or over widely separated ranges of frequency. To illustrate, frequencies in the range extending from 540 to 1620 kilocycles have been assigned for the transmission of radio broadcast s'gnals; and frequencies in the range of 54 to 88 and 174 to 216 megacycles have been assigned for the transmission of VHF television signals. To tune a conventional ser'es or parallel resonant circuit over a given frequency range, the ratio of the maximum to minimum reactance required is approximately equal to the square of the ratio of the maximum to min'mum frequencies of the given range. Thus, a circuit tunable over the radio broadcast frequency range requires a variable reactance having a maximum to minimum reactance ratio of about 9 to 1 while the ratio for television receivers is about 16 to 1.

It is sometimes desirable to use tuning elements which do not provide sufficient variation in useable reactance to tune conventional resonant circu'ts over the necessary frequency range. For example, certain advantages may be obtained by using voltage responsive reactance devices such as variable capacitance diodes, most of which have a limited maximum to minimum capacitance rat'o less than that required to tune a conventional resonant circuit over the radio broadcast frequency band. As a practical matter, the total capacitance variation is not useable for tuning purposes because of the l'mitations imposed by diode contact potential, rectification of signals of an amplitude exceeding the reverse control bias, and the fact that the diodes become increasingly inefficient as the capacitance is increased. The latter factor is due to a reduction in unloaded Q and a resultant increase in insertion loss as the diode capacitance is increased. The net effect is that, in order to mainta'n certain optimum performance specifications, only a portion of the diode capacitance variation is useable for tuning purposes.

It is an object of this invent'on to provide a tuning circuit which may be adapted to provide a much greater range of frequency variation for a given reactance variation than does a simple series or parallel resonant circuit.

Another object of this invention is to provide improved electric tuning circuits using voltage responsive reactance devices as the tunable elements thereof which may be tuned over a wide range of frequencies or which may be tuned over widely separated ranges of frequencies.

A further object of this invention is to provide improved electric tuning circuits employing voltage responsive reactance devices as the tunable elements thereof which use the most efficient portions of the variable reactance range to tune over extremely wide frequency bands.

A still further object of this invention is to provide improved tuning circuits using voltage responsive capacitance diodes which are adaptable for tuning over the frequency range assigned for the transmission of VHF television s'gnals.

In accordance with the invention a slave resonant circuit in series with a reactance element is tuned by a variable reactance device such as a voltage responsive variable capacitance diode. The slave resonant circuit which, for example, may comprise an inductor and capacitor in parallel, is resonant at a frequency between the upper and lower limits of the frequency band to be tuned. For signal frequencies higher or lower than the resonant frequency of the slave circuit, the slave circuit appears either capacitive or inductive, respectively. Thus, for a given reactance of the variable reactance device the composite circuit is resonant at two different signal frequencies; one above the resonant frequency of the slave circuit, the other below the resonant frequency of the slave circuit. The inductance to capacitance ratio of the slave c'rcuit and the reactance of the reactance element determine the spacing between the two frequencies of resonance.

As the tuning circuit of the invention is tuned by the variable reactance device, the two frequencies of resonance change in the same direction, i.e., move higher or lower simultaneously. Thus, the tuning circuit is simultaneously tuned over two different ranges of frequency, the total frequency range being greater than that which could be covered by a conventional series or parallel resonant circuit with the same tuning reactance variation.

It is accordingly a further object of this invention to provide a tun'ng circuit which is simultaneously resonant at two different frequencies.

For applications where it is desirable that tuning circuits be responsive to signals at only one frequency, frequency selective means may be provided for attenuating the undesired response. Further in accordance with the invention, the frequency selective means may comprise a second tuning circuit generally of the type described above but having different inductance to capacitance ratios to provide a different spacing in frequency between the two frequencies of response. The two circuits are connected in cascade, and each is tuned to select signals at the desired frequency. Since the undesired resonant frequency of each circuit will be different from that of the other, the select'vity of one circuit will attenuate the undesired passband of the other.

The novel features that are considered characteristic of this invention are set forth with particularity in the appended claims. The invention itself, however, both as to its organizat'on and method of operation, as well as additional objects and advantages thereof, will best be understood from the following description when read in connection with the accompanying drawings, in which:

Figures 1, 2:
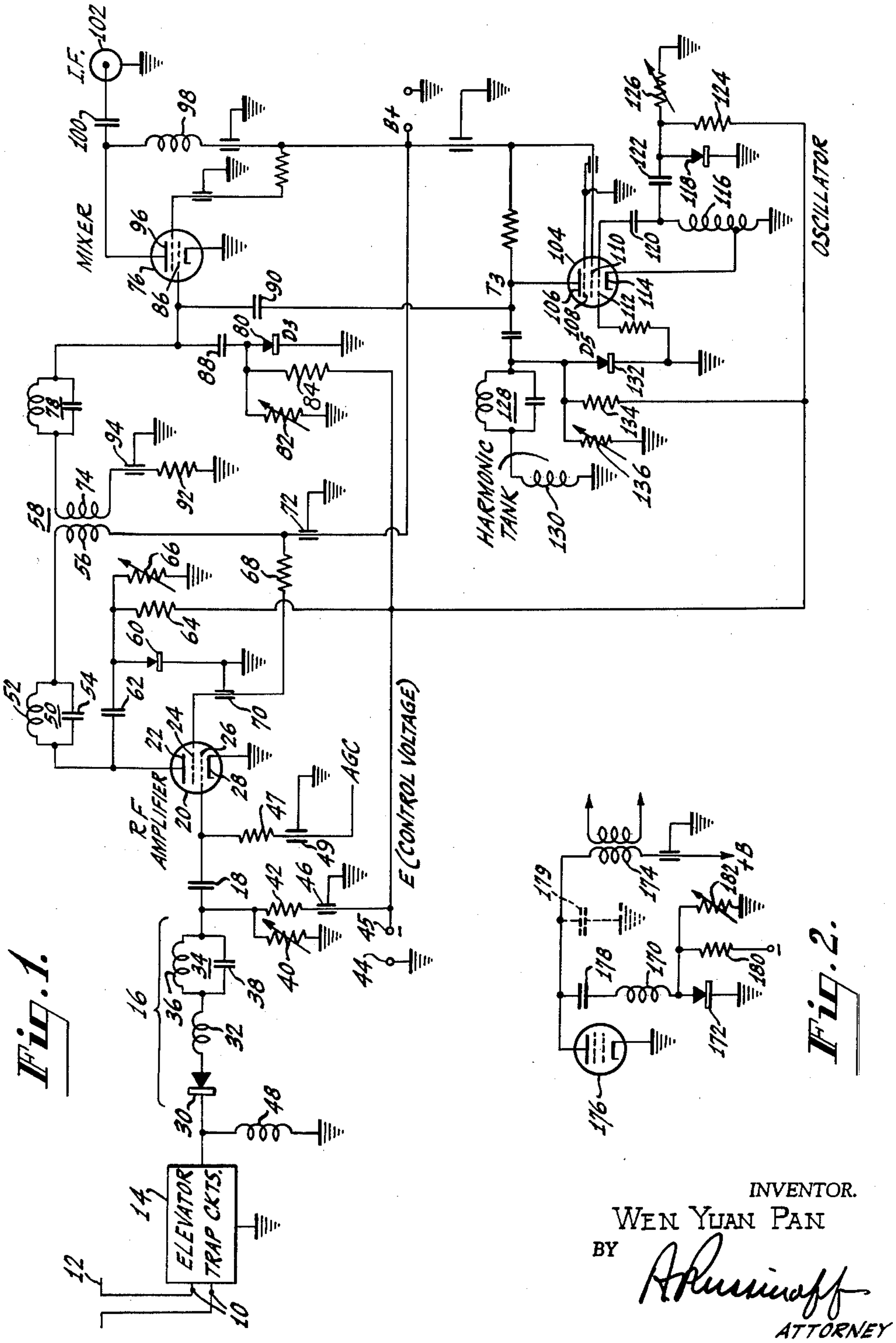
FIGURE 1 is a schematic c'rcuit diagram of a television tuner including an electric tuning system embodying the invention.
FIGURE 2 is a schematic circuit diagram of a tunable amplifier c'rcuit including the tuning circuit of the invention.
Figure 3A:
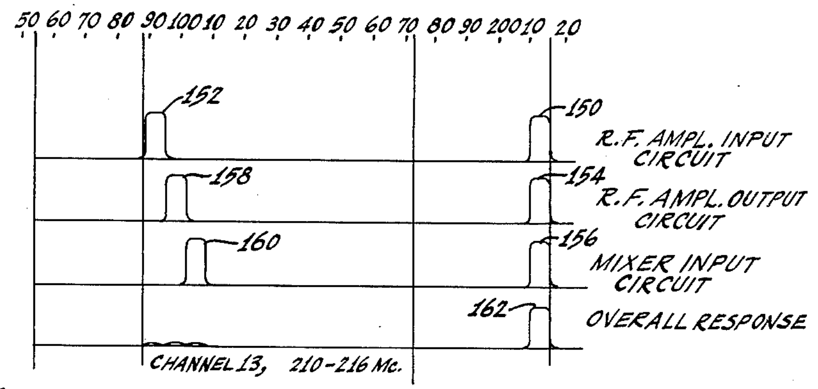
Figure 3B:
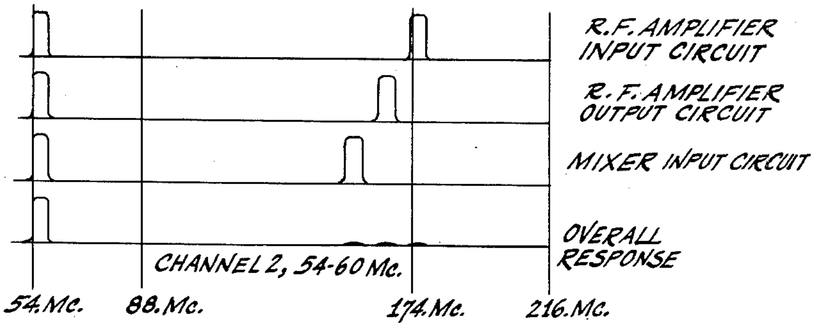
Figure 4:
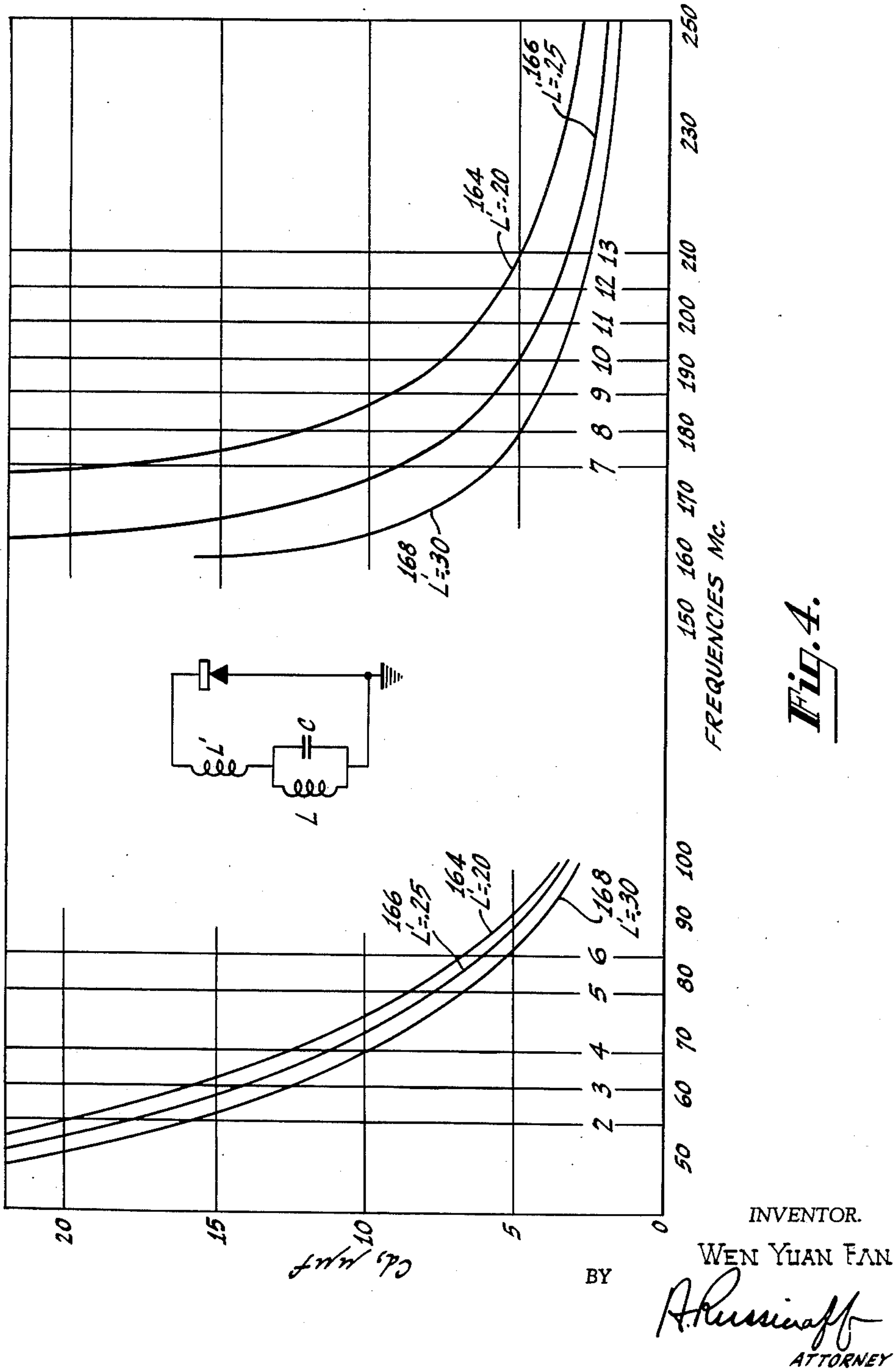
Figure 5:
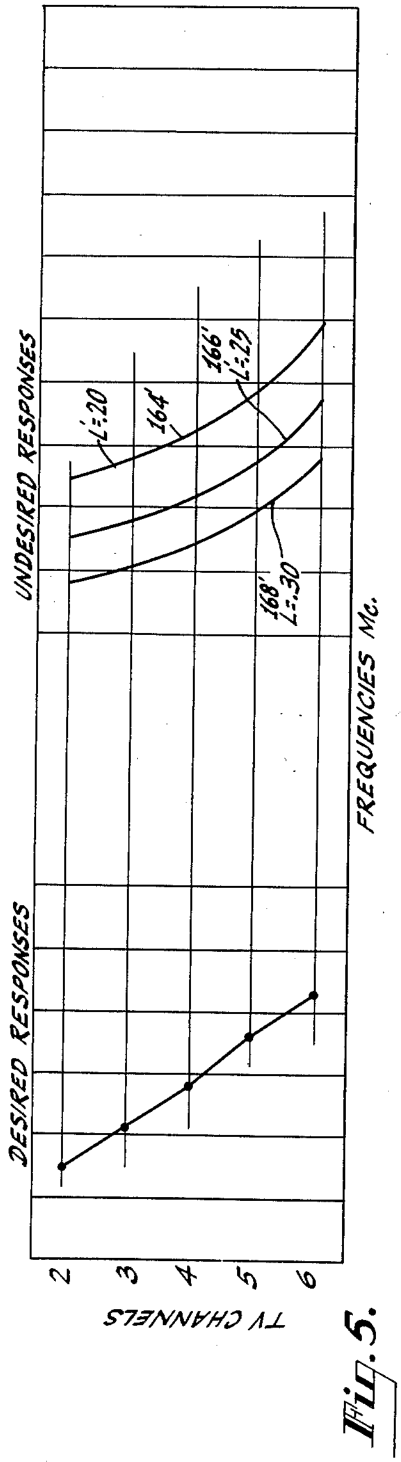
Figure 6:
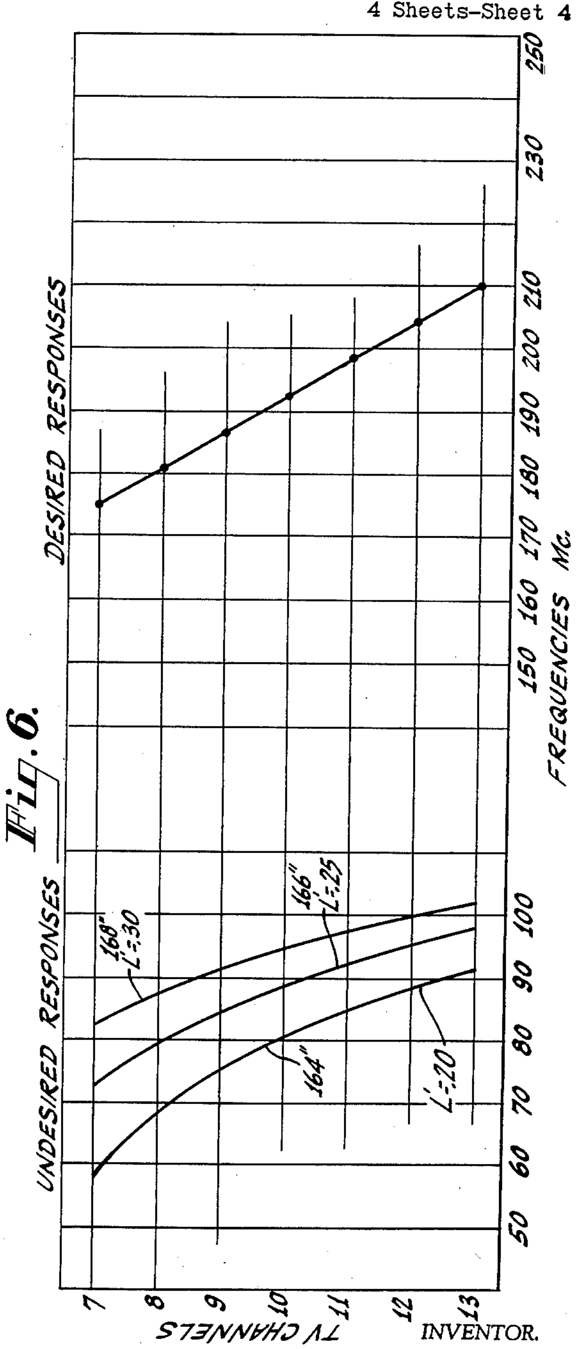

FIGURES 3*a*, 3*b*, are diagrammatic graphs indicating the individual pass band characteristics for the various tuning circuits used in the tuner as well as the overall characteristic of these circuits when connected in cascade;

FIGURE 4 is a graph of the frequency vs. tuning capacitance for the tuning circuit of the invention having given circuit parameters; and FIGURES 5 and 6 are graphs of frequency vs. television channel for showing the undesired response of the tuning circuits of FIGURE 1 for tuning to any desired channel frequency.

The television tuner shown in FIGURE 1 includes a pair of terminals 10 which may be connected through a suitable transmission line to an antenna 12. Signals intercepted by the antenna 12 are applied through the terminals 10 to elevator and trap circuits 14 which provide the necessary impedance matching and balance-to-unbalance transformation, and attenuate signals which might otherwise adversely affect the operation of a television receiver. Signals from the elevator and trap circuits 14 are then applied through a tunable signal selection circuit 16 and a coupling capacitor 18 to an R.F. amplifier tube 20 which is shown as a tetrode-type tube including an anode 22, screen grid 24, control grid 26 and cathode 28. The signal selection circuit includes a voltage responsive variable capacitance diode 30, an inductor 32 and a slave resonant circuit 34 comprising an inductor 36 and a capacitor 38 in parallel.

The tuning of the signal selection circuit 16 is controlled by the direct voltage applied to the diode 30 from a voltage divider circuit comprising a variable resistor 40 and fixed resistor 42. The voltage divider is connected between the terminals 44 and 45 of a control voltage source. The terminal 44 is shown as being directly grounded and the terminal 45, which is maintained at a negative potential with respect to ground, is bypassed for signal frequencies by a capacitor 46. The voltage developed across the variable resistor 40 is applied to the diode 30, the cathode of which is returned to ground through a radio frequency choke coil 48. As the reverse bias applied to the diode 30 is changed by adjustment of the variable resistor 40, the capacitance across the diode 30 is also changed, thereby tuning the signal selection circuit to different frequencies. The signals developed across the signal selection circuit 16 are applied to the control grid 26 across the grid resistor 47 and bypass capacitor 49. Conventional means of AGC is applied to the R.F. amplifier.

The anode 22 of the R.F. amplifier tube 20 is connected to a source of operating potential +B through a slave resonant circuit 50 including a parallel connected inductor 52 and capacitor 54, and an inductor 56 as represented by the primary winding of an R.F. transformer 58. The effective inductive reactance of the slave resonant circuit 50 and inductor 56 is tuned to the frequency of the selected signal by the capacitance presented by a voltage responsive variable capacitance diode 60, which is connected in series with a blocking capacitor 62 between the anode 22 and ground. The capacitance of the diode 60 is controlled by the magnitude of the reverse bias voltage applied thereto from a voltage divider network comprising a fixed resistor 64 and a variable resistor 66 connected between ground and the negative terminal 45 of the control voltage source. Adjustment of the resistor 66 changes the reverse bias applied to the diode 60 and thereby changes the tuning of the R.F. amplifier output circuit.

Operating potential for the screen grid 24 is supplied from the +B terminal through the resistor 68. The screen grid and +B terminal are respectively bypassed to ground for signal frequencies through the capacitors 70 and 72.

Signals developed across the primary winding 56 of the transformer 58 are inductively coupled to a secondary winding 74 which forms a portion of the tunable input circuit for a mixer stage including a mixer tube 76. More specifically, the tunable input circuit for the mixer includes the series connection of the secondary winding 74 and a slave resonant circuit 78 effectively in parallel with and tuned by the capacitance exhibited by a voltage responsive variable capacitance diode 80. The tuning of the mixer input circuit is controlled by the reverse bias applied to the diode 80 from a voltage divider network including a variable resistor 82 and a fixed resistor 84. The variable reverse bias applied to the diode 80 is isolated from the control grid 86 of the mixer tube by a D.C. blocking capacitor 88.

Local oscillator waves are coupled to the mixer control grid through a coupling capacitor 90. Grid rectification of the oscillator signals causes a voltage to be developed across a resistor 92 which is connected in circuit between the mixer control grid and cathode to provide a bias which establishes the operating characteristics of the stage. It will be observed that the resistor 92 is bypassed for signal frequencies by the capacitor 94.

The received signals applied to the control grid 86 of the mixer tube 76 are heterodyned with waves from the local oscillator stage to produce corresponding signals of intermediate frequency which are developed across an output circuit connected to the mixer tube anode 96. The mixer output circuit essentially comprises an inductor 98 which is resonant with the output capacitance of the mixer tube 76 at the receiver intermediate frequency. In the case of television receivers the intermediate frequency is usually on the order of 44 megacycles. The intermediate frequency signal developed across the mixer output circuit is coupled through a capacitor 100 to an intermediate frequency output terminal 102.

The local oscillator stage which provides the heterodyning waves includes a pentode electron tube 104, having an anode 106, a suppressor grid 108, a screen grid 110, a control grid 112 and cathode 114. Oscillatory waves at a relatively low frequency are generated by the portion of the tube 104 including the screen grid 110, control grid 112 and cathode 114 with the screen grid operating as the oscillator anode. The frequency of the oscillatory waves are controlled by a tank circuit including an inductor 116 effectively connected in parallel with a voltage responsive variable capacitance diode 118. The control grid 112 is connected to the tank circuit through a coupling capacitor 120, and the cathode 114 is connected to a tap on the inductor 116. The capacitance of the diode 118 is controlled by the voltage applied thereto from a voltage divider comprising a fixed resistor 124 and a variable resistor 126. These resistors, as in the case of the voltage dividers previously described, are connected between ground and the negative terminal 45 of the operating potential supply source. A D.C. blocking capacitor 122 is connected between the diode 118 and the inductor 116 to prevent shorting the D.C. control voltage to ground through the low D.C. resistance of the inductor 116.

The oscillator is tunable over a relatively narrow range of frequencies by the diode 118, and appropriate harmonics are derived in the oscillator output circuit to provide a beat signal of the proper frequency. To this end, a harmonic tank circuit is connected with the anode 106 of the oscillator tube 104. The harmonic tank circuit includes a slave resonant circuit 128 in series with an inductor 130. This portion of the circuit is in parallel with and tuned by a voltage responsive variable capacitance diode 132. A voltage divider comprising the fixed resistor 134 and a variable resistor 136 are connected between ground and the negative terminal 45 of an operating potential supply source to control the reverse bias applied to, and hence the capacitance across the terminals of the diode 132.

It will be noted that each of the tuning circuits with the exception of the oscillator tank circuit includes a slave resonant circuit. The slave resonant circuits are tuned to a frequency between the upper and lower limits of the band of frequencies to be covered by the tuning system. By way of example, the slave circuits 34, 50 and 78 are tuned to approximately the geometric mean between the frequencies of Channels 6 and 7, or approximately 122 megacycles. Thus, for signals below 122 megacycles the slave circuits appear inductive and for signals above 122 megacycles the slave circuits appear capacitive.

For a given capacitance setting of the diode, each of the composite tuning circutis is responsive to signals in two separate portions of the frequency spectrum. One response is below and the other above the resonant frequency of the slave circuit. The relative spacing of the two response characteristics is a function of the inductance to capacitance ratio of the slave resonant circuit and of the magnitude of the inductance in series with the slave circuit.

In accordance with one aspect of the invention, the parameters of the various tuning circuits associated with the R.F. amplifier and mixer are selected so that the spacing in frequency between the two response characteristics is different for each circuit. To select and pass a desired signal, all of the circuits are tuned to resonance at the desired signal frequency. If desired, the responses may be staggered to provide the desired overall band-pass characteristic. However, the alternate pass band characteristics for the three circuits are stagered so that each circuit attenuates signal frequencies in the alternate pass band of the other two circuits.

Referring to FIGURES 3*a* and 3*b*, when the tuner is set to receive Channel 13 television signals, the R.F. amplifier input circuit is tuned to pass signals between 210 and 216 megacycles (Channel 13) as indicated by the portion 150 of the response curve. The alternate pass band of the R.F. amplifier input circuit falls in the range of 82–88 megacycles as indicated by the portion 152 of the response curve. The R.F. amplifier output circuit, and mixer input circuit are also tuned to pass signals in the range between 210 and 216 megacycles as represented by the curves 154 and 156 respectively. The alternate pass band response for these circuits is from 90 to 96 megacycles and 96 to 102 megacycles as indicated by the curves 158 and 160.

The three tuning circuits are thus tuned to provide optimum response to Channel 13 signals so that these signals are efficiently conveyed to the mixer input electrode. It will be noted that the R.F. amplifier input circuit 16 also passes Channel 6 signals (82–88 megacycles) to the R.F. amplifier tube control grid 26. However, the R.F. amplifier output circuit and the mixer input circuit attenuate signals at these frequencies, and are sufficiently selective to effectively prevent these signals from reaching the mixer tube. In like manner, the R.F. amplifier and mixer input circuits attenuate those signals which fall in the alternate pass band of the R.F. amplifier output circuit, and the R.F. amplifier input and output circuits attenuate those signals falling in the alternate pass band of the mixer input circuit. The overall response characteristic of the three tuning circuits in cascade is shown by the curve 162 of FIGURE 3*a*.

For tuning to frequencies in the lower portion (Channels 2–6) of the VHF television band, the lower frequency pass band responses are aligned at the desired channel frequency as indicated in FIGURE 3*b*. In this case, the upper pass band or alternate response is staggered in a manner similar to that explained hereinbefore.

The response characteristics of specific circuit components used in the three tuning circuits are shown in FIGURES 4, 5 and 6. The curves of FIGURE 4 show the resonant frequency of tuning circuits with different amounts of series inductance as the capacitance of the diode is changed. For the curve 164 the series inductance is .20 microhenry; for the curve 166 the series inductance is .25 microhenry; and for the curve 168 the series inductance is .30 microhenry. For each of the curves, the slave resonant circuit inductance is .173 microhenry and capacitance is 10 micromicrofarads. By way of example, the curves 164, 166 and 168 may correspond to the tuning characteristics of the R.F. amplifier input circuti, R.F. amplifier output circuit, and mixer input circuits respectively.

It can be seen that each of the curves are in two parts, one in the frequency range of 50 to 100 megacycles and the other in the frequency range of 160–250 megacycles. With these curves it is possible to determine the position of the two response characteristics for any of the tuning circuits for a given capacitance (ordinate) setting of the tuning diode. To illustrate, for a diode capacitance of 13 micromicrofarads, the R.F. amplifier input circuit (curve 164) is tuned to the Channel 4 frequency which is indicated as being 67.25 mc. The alternate response of this tuning circuit, where the 13 micromicrofarad mark on the ordinate crosses the curve 164 the second time, is in the neighborhood of the Channel 8 frequency which is indicated as being about 181 mc.

The graph of FIGURE 5 shows the alternate responses of the three tuning circuits when each is tuned to a desired one of the lower frequency television Channels 2 to 6. To illustrate when each of the three tuning circuits is tuned to the Channel 3 frequency (indicated on the ordinate), the R.F. amplifier input circuit is also tuned to 178 mc. This is the point where a horizontal line extended across from the Channel 3 point on the ordinate intersects the curve 164'. In like manner, it can be seen that the R.F. amplifier output circuit is tuned to 168 mc., and the mixer input circuit is tuned to 161 mc., for Channel 3 operation.

FIGURE 6 is similar to FIGURE 5 except that the alternate responses are shown when a desired one of the upper VHF television channels is selected. The R.F. amplifier input circuit response is represented by the curve 164'', the R.F. amplifier output circuit response by the curve 166'', and the mixer input circuit response by the curve 168''.

It should be understood that the specific tuning circuits shown may be replaced by the equivalents thereof. For example, with respect to the circuit shown in FIGURE 4, the same general mode of operation can be effected by using three parallel legs: the first comprising a series inductor and capacitor; the second an inductor; and the third a capacitive tuning element. In this case the first leg comprises the slave resonant circuit. Alternatively, as shown in FIGURE 2 the tuning circuit also includes three parallel legs. The first leg comprises the slave resonant circuit including an inductor 170 in series with the capacitive tuning element 172. The second leg includes a second inductor 174, and the third leg includes the output capacitance 179 of the tube 176. The tuning circuit is shown as connected to the anode of the tube 176 which may comprise an R.F. amplifier. The capacitor 178 is a D.C. blocking capacitor and the resistors 180 and 182 comprise the reverse bias voltage divider for the diode 170.

The oscillator tank circuit is tunable over a relatively narrow range of low frequencies, and an appropriate harmonic is selected for application to the mixer circuit. The frequency of the oscillator signal actually applied to the mixer where a 44 mc. I.F. output is desired varies from 101 mc. for Channel 2 operation to 257 mc. for Channel 13 operation. This frequency range requires a maximum to minimum tuning capacitance variation of over 6 to 1 for conventional circuits. The oscillation circuit of this invention, however, can be tuned over the desired frequency range using a much smaller maximum to minimum capacitance ratio, thereby permitting operation of the variable capacitance diode at its most efficient operating point.

The oscillator tank circuit shown in FIGURE 1 is tunable over a frequency range of 25.25 mc. to 32.25 mc., by varying the reverse bias applied to the diode 118. The maximum to minimum capacitance ratio required of this diode for such a tuning range is less than 2 to 1. A suitable harmonic of the oscillator tank circuit is selected by the harmonic tank circuit connected to the oscillator anode 106. For example, when Channel 2 is being received, the oscillator tank cicruit is tuned to 25.25 mc. and the harmonic tank circuit is tuned to the fourth harmonic of 25.25 mc. or 101 mc. For Channel 13 operation the oscillator tank circuit is tuned to 32.25 mc., and the harmonic tank circuit is tuned to the eighth harmonic of this frequency or 257 mc.

The harmonic tank circuit is of the same general configuration as the R.F amplifier output circuit and the mixer input circuit and exhibits responses at two different frequencies. The parameters of this circuit are selected so that a given variation in the capacitance of the diode 132 simultaneously tunes the harmonic tank circuit over the ranges of frequency extending from 101 mc. to 129 mc., and from 221 mc. to 257 mc. The circuit parameters are also chosen so that when the harmonic tank circuit is tuned to a desired frequency harmonically related to the oscillator tank circuit, the alternate response is not harmonically related to the resonance frequency of the oscillator tank circuit. Since the harmonic tank attenuates signals which are not harmonics of the fundamental oscillator frequency, only oscillator signals of desired frequencies are fed to the mixer.

What is claimed is:

1. A signal selection circuit comprising a plurality of tuning circuits each simultaneously resonant at at least two different frequencies, the frequency difference between said different frequencies being different for each of said tuning circuits, means connecting said tuning circuits in cascade, and means for aligning one of the resonant frequencies for each of said tuning circuits to the same frequency.

2. A wide band signal selection circuit comprising a plurality of tuning circuits each having means providing a slave resonant circuit including inductive and capacitive reactance means resonant at a frequency in said wide band, thereby appearing capacitive over one portion of said wide band and inductive over another portion of said wide band, and further reactance means connected with said slave resonant circuit to resonate with the apparent capacitance and inductance thereof at two separate and spaced frequencies in said wide band, one of said capacitive and further reactance means comprising a voltage responsive variable capacitance diode, the frequency difference between the two spaced frequencies of resonance being different for each of said tuning circuits, means connecting said tuning circuits in cascade, and means for applying reverse bias voltages to the diodes in each of said circuits to align one of the frequencies of resonance of all of said tuning circuits to the same frequency.

3. A signal selection circuit comprising a plurality of tuning circuits each having at least two spaced frequency bandpass responses existing at the same time, the frequency difference between said bandpass responses being different for each of said tuning circuits, means connecting said tuning circuits in cascade, and means for tuning said circuits to align one of the bandpass responses thereof to pass signals of a first frequency in a first mode of operation and for tuning said circuits to align the other of the bandpass responses of said circuits to pass signals of a second frequency in a second mode of operation.

4. A signal selection circuit comprising a plurality of tuning circuits each resonant to signals in two spaced frequency bands, the frequency difference between said frequencies of resonance being different for each of said tuning circuits, means connecting said tuning circuits in cascade, and means for tuning said circuits over a first range of frequencies by aligning one of the frequencies of resonance of each of said circuits to provide a predetermined bandpass characteristic for a signal in said first range of frequencies whereby signals of a frequency corresponding to the alternate frequencies of resonance of any of said tuning circuits are attenuated by the other of said tuning circuits, and for tuning over a second range of frequencies by aligning the alternate frequencies of resonance of each of said circuits to provide a predetermined bandpass characteristic for a signal in said second range of frequencies whereby signals of a frequency corresponding to the first named frequencies of resonance of any of said tuning circuits are attenuated by the other circuits.

5. A signal selection circuit for a television receiver for selecting any one of a plurality of signals in the VHF television band comprising an R.F. amplifier having a tunable input circuit and a tunable output circuit, a signal mixer stage having a tunable input circuit coupled to said R.F. output circuit, each of said tunable circuits having at least two separate resonance characteristics for different signal frequencies, the frequency difference between said resonance characteristics being different for each of said tunable circuits, and tuning means for each of said tunable circuits to adjust one of said resonance characteristics of each of said tunable circuits to substantially the same frequency for selecting a signal near one end of said VHF television frequency band and for adjusting the other of said response characteristics for each of said tunable circuits to substantially the same frequency for selecting a signal near the other end of the VHF television band.

6. A signal selection circuit for a television receiver for selecting any one of a plurality of signals in the VHF television band comprising an R.F. amplifier having a tunable input circuit and a tunable output circuit, a signal mixer stage having a tunable input circuit coupled to said R.F. output circuit, each of said tunable circuits comprising means providing a slave resonant circuit including inductive and capacitive reactance means resonant to a frequency in said wide band thereby appearing capacitive over one portion of said wide band and inductive over another portion of said wide band, and further reactance means connected with said slave resonant circuit to resonate with the apparent capacitance and inductance thereof at two separate and spaced frequencies in said wide band, one of said capacitive and further reactance means comprising a voltage responsive variable capacitance diode, the frequency difference between said two separate and spaced frequencies of resonance being different for each of said tunable circuits, bias voltage means connected with the diodes in each of said tunable circuits, and means for adjusting said bias voltage to align one of said frequencies of resonance for each of said tunable circuits to the same channel frequency for selecting a signal in a first portion of said VHF television frequency band and for aligning the other of said frequencies of resonance for each of said tunable circuits to the same frequency for selecting a signal in another portion of the VHF television band.

7. A wide band tuning circuit comprising a first circuit path including an inductor in series with a slave resonant circuit, said slave resonant circuit comprising the parallel combination of an inductor and capacitor resonant at a frequency within the frequency of said wide band, a second circuit path comprising a diode of the type which exhibits a capacitance the magnitude of which is a function of the reverse bias applied to the diode, means connecting said first and second circuit paths in parallel, and reverse bias control means connected with said diode.

8. A wide band tuning circuit comprising a diode of the type exhibiting a capacitance the magnitude of which is an inverse function of the reverse bias applied to said diode, an inductor, a slave resonant circuit comprising a parallel connected inductor and capacitor tuned to a frequency within said wide band, means connecting said diode, said inductor and said slave resonant circuit in series, and reverse bias control means connected with said diode for applying controllable reverse bias thereto, and thereby controlling the tuning of said circuit.

9. In a television tuner for selecting any one of a plurality of signals in the VHF television band, a mixer, an oscillator coupled to said mixer for providing a heterodyning wave for mixing with the selected signal in said mixer to provide a corresponding signal of intermediate frequency, said oscillator tunable over a range of frequencies having a maximum-to-minimum frequency ratio relatively much smaller than the maximum-to-minimum tuning ratio of said VHF television band, a tunable coupling circuit of the type exhibiting two separate and spaced frequency pass bands coupled between said oscillator and mixer, means for tuning said oscillator to a subharmonic of the desired heterodyning signal, and means for tuning said coupling circuit so that one of the frequency pass bands thereof corresponds to a harmonic of said oscillator frequency and the other of said pass band is harmonically unrelated to the frequency of said oscillator circuit.

10. A high frequency oscillator comprising an amplifying device, means connecting said device to sustain oscillations comprising a tunable resonant tank circuit tunable over a first range of frequencies, a tunable output circuit for said oscillator connected with said device, said output circuit exhibiting two separate and spaced frequency pass bands, means for tuning said output circuit so that one of the frequency pass bands thereof corresponds to a harmonic of the frequency of said tank circuit and the other of said pass band is harmonically unrelated to the frequency of said tank circuit.

11. A wide band high frequency oscillator circuit comprising a tank circuit including a variable capacitance diode, means providing a controllable reverse bias voltage source connected with said diode for tuning said tank circuit to a subharmonic of the desired oscillator output frequency, a tunable output circuit for said oscillator, said output circuit having slave resonant circuit including inductive and capacitive reactance means resonant to a frequency in said wide band thereby appearing capacitive over one portion of said wide band and inductive over another portion of said wide band, and further reactance means connected with said slave resonant circuit to resonate with the apparent capacitance and inductance thereof at two separate and spaced frequencies in said wide band, one of said reactance means comprising a second variable capacitance diode, means for applying a reverse bias of a first magnitude from said source to said second diode for tuning said output circuit so that lower one of said resonant frequencies of said output circuit corresponds to a harmonic of the resonant frequency of said tank circuit and the higher one of said resonant frequencies is harmonically unrelated to the resonant frequency of said tank circuit for a first oscillator output frequency and for applying a reverse bias of a second magnitude from said source to said second diode to tune said output circuit so that the higher one of said resonant frequencies corresponds to a harmonic of the resonant frequency of said tank circuit and the lower one of said resonant frequencies is harmonically unrelated to the resonant frequency of said tank circuit for a second oscillator output frequency.

12. A high frequency oscillator circuit comprising an electron tube having an anode, a cathode, a control grid and an auxiliary grid, circuit means connected to sustain oscillations between said cathode, control grid and auxiliary grid including an oscillator tank circuit tunable over a first range of frequencies, a tunable output circuit for said oscillator connected with said anode, said output circuit being of the type exhibiting two separate and spaced frequencies of resonance, means for tuning said tank and output circuits so that one of said frequencies of resonance corresponds to a harmonic of a frequency of said tank circuit and the other of said pass bands is harmonically unrelated to the frequency of said tank circuit for a first oscillator output frequency and for tuning said tank and output circuits so that the other of said frequencies of resonance corresponds to a harmonic of the frequency of said tank circuit and said one of said pass bands is harmonically unrelated to the frequency of said tank circuit for a second oscillator output frequency.

References Cited in the file of this patent

UNITED STATES PATENTS

| | | |
|---|---|---|
| Re. 21,246 | Hansell | Dec. 17, 1940 |
| 2,182,377 | Guanella | Dec. 5, 1939 |
| 2,455,824 | Tellier | Dec. 7, 1948 |
| 2,580,051 | Torre | Dec. 25, 1951 |
| 2,601,467 | Torre | June 24, 1952 |
| 2,687,514 | Roberts | Aug. 24, 1954 |
| 2,760,060 | Wittenburg et al. | Aug. 21, 1956 |
| 2,798,158 | Horowitz | July 2, 1957 |
| 2,811,647 | Nilssen | Oct. 29, 1957 |
| 2,855,508 | Barlow | Oct. 7, 1958 |
| 2,896,018 | Rhodes et al. | July 21, 1959 |
| 2,907,960 | Avins | Oct. 6, 1959 |
| 2,915,631 | Nilssen | Dec. 1, 1959 |

OTHER REFERENCES

Article: "Junction Diode A.F.C. Circuit," Johnston, Wireless World, August 1956, pages 354–355.